(12) United States Patent
Ducrey et al.

(10) Patent No.: US 11,353,499 B2
(45) Date of Patent: Jun. 7, 2022

(54) ELECTRONIC CHIP WITH ANALOG INPUT AND OUTPUT

(71) Applicant: STMicroelectronics (Grenoble 2) SAS, Grenoble (FR)

(72) Inventors: Stéphane Ducrey, Voiron (FR); Pascal Raga, St Ismier (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 195 days.

(21) Appl. No.: 16/557,365

(22) Filed: Aug. 30, 2019

(65) Prior Publication Data
US 2020/0081059 A1 Mar. 12, 2020

(30) Foreign Application Priority Data
Sep. 12, 2018 (FR) ...................................... 1858150

(51) Int. Cl.
*G01R 31/28* (2006.01)
(52) U.S. Cl.
CPC ................ *G01R 31/2884* (2013.01)
(58) Field of Classification Search
CPC .......... G01R 31/2884; G01R 31/31713; G01R 31/31716; G01R 31/31712; G11C 29/1201; G11C 29/12
See application file for complete search history.

(56) References Cited

U.S. PATENT DOCUMENTS

| | | | |
|---|---|---|---|
| 5,898,703 A | 4/1999 | Lin | |
| 6,714,888 B2 | 3/2004 | Mori et al. | |
| 7,143,374 B1 * | 11/2006 | Keller | G06F 30/33 716/111 |
| 7,181,384 B1 * | 2/2007 | Riggs | G06F 30/34 703/14 |
| 7,271,751 B2 | 9/2007 | Peterson et al. | |
| 7,856,048 B1 * | 12/2010 | Smaini | H04B 1/40 375/221 |
| 7,856,581 B1 | 12/2010 | Tabatabaei et al. | |
| 2001/0016933 A1 * | 8/2001 | Chang | G06F 30/33 716/122 |
| 2001/0033583 A1 * | 10/2001 | Rabenko | H04B 3/23 370/503 |

(Continued)

FOREIGN PATENT DOCUMENTS

| | | |
|---|---|---|
| JP | H0462642 A | 2/1992 |
| JP | 2000315771 A | 11/2000 |
| JP | 2008286699 A | 11/2008 |

OTHER PUBLICATIONS

V. Chandrasekhar, C. H. Chen and K. Yelamarthi, "Low-Cost Low-Power Self-Test Design and Verification of On-Chip ADC for System-on-a-Chip Applications," 2006 IEEE Instrumentation and Measurement Technology Conference Proceedings, 2006, pp. 1301-1306 (Year: 2006).*

(Continued)

*Primary Examiner* — Daniel R Miller
(74) *Attorney, Agent, or Firm* — Slater Matsil, LLP

(57) ABSTRACT

An electronic chip includes an analog input connection pad and an analog output connection pad. A switch is coupled between the analog input connection pad and the analog output connection pad. In one embodiment, the chip operates in a self-test mode and in an active mode. The switch is closed only in the self-test mode.

23 Claims, 3 Drawing Sheets

(56) References Cited

U.S. PATENT DOCUMENTS

| | | | |
|---|---|---|---|
| 2003/0208708 A1 | 11/2003 | Sunter | |
| 2005/0193363 A1* | 9/2005 | Gupta | G03F 1/36 |
| | | | 716/53 |
| 2008/0184184 A1* | 7/2008 | McCracken | G06F 30/30 |
| | | | 716/113 |
| 2011/0109321 A1 | 5/2011 | Kawabata et al. | |
| 2011/0156738 A1 | 6/2011 | Jeon et al. | |
| 2011/0241914 A1* | 10/2011 | Lai | H03M 1/109 |
| | | | 341/120 |
| 2013/0137381 A1* | 5/2013 | Vassiliou | H04B 1/56 |
| | | | 455/67.15 |
| 2014/0266824 A1* | 9/2014 | Lowney | H03M 1/1009 |
| | | | 341/120 |
| 2015/0120219 A1* | 4/2015 | Merlin | H04B 1/0458 |
| | | | 702/58 |
| 2016/0231378 A1* | 8/2016 | Abhishek | G01R 31/2884 |
| 2017/0258362 A1* | 9/2017 | Myers | A61B 5/073 |

OTHER PUBLICATIONS

Signal Conditioning, available at https://web.archive.org/web/20170104233529/https://en.wikipedia.org/wiki/Signal_conditioning (Year: 2017).*

* cited by examiner

ELECTRONIC CHIP WITH ANALOG INPUT AND OUTPUT

CROSS-REFERENCE TO RELATED APPLICATIONS

This application claims priority to French Patent Application No. 1858150, filed on Sep. 12, 2018, which application is hereby incorporated herein by reference.

TECHNICAL FIELD

The present disclosure generally concerns electronic circuits and, in particular embodiments, an electronic integrated circuit chip designed to generate and/or receive analog signals.

BACKGROUND

Certain electronic integrated circuit chips comprise analog circuits. Generally, analog signals generated and/or received by these circuits come out of and enter the chips respectively through analog outputs and inputs.

SUMMARY

An embodiment overcomes all or part of the disadvantages of known electronic chips having analog inputs/outputs.

An embodiment overcomes all or part of the disadvantages of known analog electronic chip circuits.

An embodiment provides an electronic chip comprising at least two respective analog input and output connection pads and at least one electrical link capable of being temporarily activated between the input and output pads.

According to an embodiment, the chip comprises a generator of analog signals configured to apply the analog signals to the output pad.

According to an embodiment, the chip is configured so that the link is always inactive outside of a self-test phase.

According to an embodiment, the chip comprises a receiver configured to receive an analog signal applied to the input pad.

According to an embodiment, the link comprises a switch connected between the pads, or a plurality of switches series-connected between the pads.

According to an embodiment, the chip comprises one or a plurality of first memory locations for storing logic levels of control of the switch(es).

According to an embodiment, the chip is configured to protect, with a password, the writing into the first memory locations.

According to an embodiment, the chip comprises additional chips which can be activated in a phase of use of the chip, and second memory locations for storing logic levels of control of the additional switches.

According to an embodiment, the first locations are configured to further store additional logic levels of control of the additional switches in a self-test phase.

An embodiment provides a method designing a chip such as defined hereabove.

According to an embodiment, the design method comprises associating each of the pads with one of the switches in a design block of a computer design library, the design blocks being identical for the pads and preferably each comprising a resistor connected to the pad.

According to an embodiment, the design block comprises a plurality of, preferably three, switches connected to the pad.

An embodiment provides a method of self-test of an electronic chip, comprising activating at least one electrical link between at least two respective analog signal input and analog signal output pads.

According to an embodiment, the self-test method comprises simultaneously testing an analog signal generator and an analog signal receiver.

According to an embodiment, the self-test method comprises the reception by the receiver of a signal generated by the generator and transmitted from the output pad to the input pad over the link.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
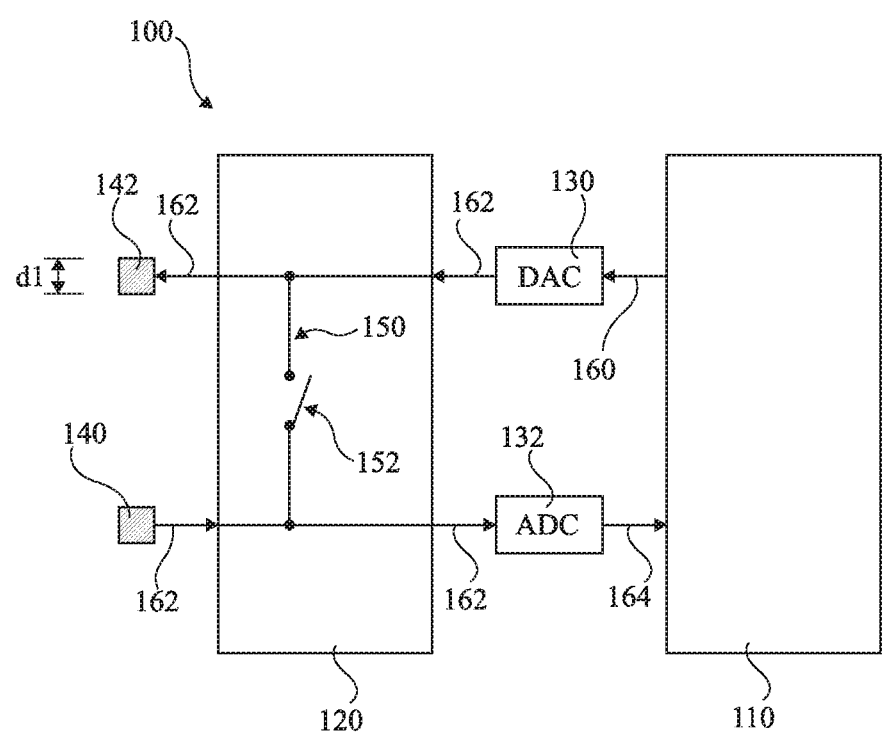
FIG. 1 schematically shows an embodiment of an electronic chip with analog inputs/outputs.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the digital circuits of an electronic chip with analog inputs/outputs are not shown in detail, the described embodiments being compatible with usual electronic chips with analog inputs/outputs. Further, the integrated circuit packages are not shown, the described embodiments being compatible with usual packages.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 schematically shows an embodiment of an electronic chip 100 with analog inputs/outputs.

Chip 100 typically comprises a semiconductor wafer, not shown, and circuits formed inside and on top of the wafer.

Chip 100 is preferably a chip of system-on-chip type (SOC). SOC-type chips are particularly used in embarked or mobile applications, such mobile telephony, connected objects, household appliances, or transport. Preferably, chip 100 is intended to be arranged in an integrated circuit package (not shown). The package is preferably intended to be connected, for example, welded or soldered, to an external electronic device such as a PCB-type ("Printed Circuit Board") circuit.

Chip 100 comprises a digital circuit 110. Circuit 110 typically comprises at least one sequential data processing unit, for example, of microprocessor type, and various peripherals such as memories and/or interfaces of digital communication with the outside of the chip.

Circuit 110, and in particular the microprocessor, communicates with an analog circuit 120 of the chip, preferably through digital/analog interface circuits. Digital/analog interface circuits are typically of DAC digital-to-analog converter 130 type or of ADC analog-to digital converter 132 type. Although two DAC and ADC circuits are shown as an example, the chip may comprise more than two digital/analog interface circuits, for example, a plurality of DAC-type circuits and/or a plurality of ADC-type circuits. Further, the digital/analog interface circuits of the chip may be of any type, possibly other than DAC or ADC. The chip may for example comprise a digital/analog interface circuit such as a comparator, which outputs a digital signal from an analog signal.

Analog circuit 120 is coupled to connection pads 140 and 142. As an example, FIG. 1 shows a single output pad 142, and a single input pad 140. However, the chip preferably comprises more than two input connection pads 140 and the chip preferably comprises more than two output connection pads 142. Connection pads 140, 142 are typically formed of conductive areas, for example, metal areas, located on a surface of chip 100. These areas for example have a same rectangular or square shape. These areas preferably have a side length d1 in the range from 50 μm to 150 μm. The connection pads are connectable to circuits external to the chip, preferably to the package where the chip is intended to be arranged. The pads are preferably connectable by soldering or welding, for example, to pins of the package. The pins are intended to be soldered or welded to a device external to the package.

Pads 140 are analog inputs pads and pads 142 are analog output pads, that is, respectively, for letting in analog signals and outputting analog signals. The term analog signal here designates an electric signal representing information and having a value varying continuously when the represented information varies continuously. Preferably, the signal is capable of taking any value in a continuous range of values. Preferably, the signal is not capable of taking values outside of this range. The value of the signal is preferably a voltage or current value.

The voltage value preferably corresponds to the potential of the concerned input or output pad, referenced to a reference potential, for example, the ground. As a variation, the signal corresponds to the difference between the potentials of two inputs pads of the signal, or of two output pads of the signal.

As an example, the analog signal has a range of voltage values preferably comprised within the range from 0 V to 5 V, for example, comprised within the range from 0 V to 3.6 V. In another example, the analog signal has a range of current values for example comprised within the range from −10 mA to 10 mA. In use, the analog input signals typically originate from sensors external to the chip. The analog output signals are typically used by actuators external to the chip.

In the present embodiments, the chip comprises a link 150 between output and input pads 142 and 140. Link 150 comprises a switch 152. As a variation, link 150 comprises a plurality of switches in series, for example, two or more switches. Preferably, the switches comprise, or are formed by, transistors. The transistors for example are field effect transistors such as MOS transistors, or for example bipolar transistors.

In operation, when switch 152 is on, or conductive, link 150 is active, that is, transmits to one of the pads that it couples, for example, pad 142, any signal applied to the other one of the pads, for example, pad 140. When switch 152 is off, or non-conductive, link 150 is inactive. Thus, link 150 may be temporarily activated by the turning on, and then by the turning-off, of switch 152. As a variation, the chip may comprise other links 150 capable of being temporarily activated between analog input and output pads.

Preferably, output pad 142 is coupled, for example, connected, to an output of DAC circuit 130. Preferably, input pad 140 is coupled, for example, connected, to an input of ADC circuit 132.

Preferably, a BIST ("Built In Self Test") phase of self-test of the chip is provided. During this phase, digital circuit 110 in particular verifies the proper operation of analog circuit 120 and of digital/analog interface circuits 130 and 132. Preferably, link 150 is active during at least part of the self-test phase.

When link 150 is active, the digital circuit 110 of the chip sends a digital value 160 to DAC circuit 130. DAC circuit 130 generates an analog signal 162 according to digital value 160. Signal 162 is applied to pad 142. Link 150 then applies signal 162 to pad 140. Signal 162 is received by ADC circuit 132. ADC circuit 132 converts this signal into a digital value 164. Digital value 164 is received by digital circuit 110. Digital circuit 110 then verifies that the received digital value 164 is that which is expected to be obtained for a proper operation of circuits 130 and 132. The activation of link 150 thus enables to simultaneously test circuits 130 and 132.

The operation of DAC circuit 130 is thus tested without measuring the signal 162 applied to pad 142 by a device external to the chip. The operation of ADC circuit 132 is further tested without applying to pad 140 a signal generated by a device external to the chip. The chip testing is thus simplified. Further, none of the connection pads of the chip has been used to test circuits 130 and 132, and the number of analog and/or digital connection pads used to test all the chip circuits has thus been decreased.

Preferably, a same chip enables to execute a plurality of functions corresponding to a plurality of applications. Thus, a plurality of identical chips are intended to be arranged in different integrated circuit packages. This enables to select the package according to a targeted application. It is preferably provided for some of connection pads 140, 142 to be connected or coupled to a pin of the package for certain applications and to be connected to no pin for other applications. Packages having different numbers of pins are thus provided for a same chip. Link 150 then enables to test the operation of DAC circuit 130 and ADC circuit 132 when the chip is located in a package and pad(s) 140 and/or 142 are not connected.

Further, the signal 162 reaching the diagnosed ADC circuit 132 may have a shorter path, less exposed to disturbances, for example, electromagnetic, than a signal generated by a device external to the chip. The accuracy of the test is thus improved with respect to that of a test using a device external to the chip.

Preferably, link 150 is always inactive outside of the self-test phase. In particular, link 150 remains preferably inactive during a phase of use of the chip. This enables to use DAC circuit 130 and ADC circuit 132 independently from each other, that is, DAC circuit 130 and ADC circuit 132 may generate and receive different analog signals, used by and originating from devices external to the chip.

As a variation, DAC circuit 130 may be replaced with any other analog signal generation circuit, such as for example an amplifier or a reference voltage generator. ADC circuit 132 may be replaced with any other analog signal reception circuit, for example comprising an amplifier or a comparator. Due to link 150, the generator and the receiver can be tested simultaneously during the self-test phase, and can be used independently from each other during the phase of use. Preferably, the chip comprises a plurality of links 150 coupling the output pads of a plurality of analog signal generators to input pads of one or a plurality of analog signal receivers. Each link 150 then enables to simultaneously test a generator and a receiver during the self-test.

Figure 2:
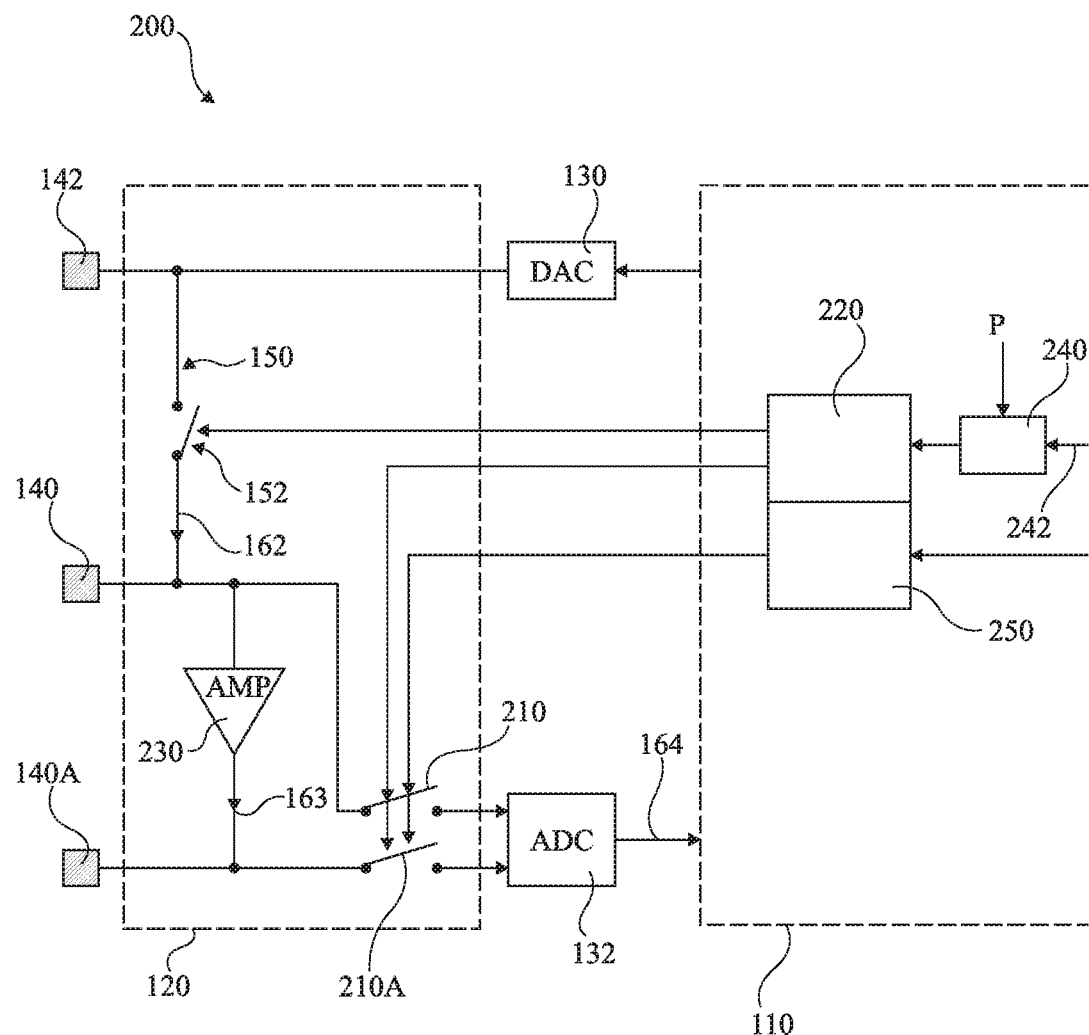
FIG. 2 schematically shows another embodiment of an electronic chip with analog inputs/outputs.

FIG. 2 schematically shows an embodiment of an electronic chip 200 with analog inputs/outputs. Chip 200 comprises the elements of chip 100 of FIG. 1, identically or similarly coupled together, with the difference that pad 140 is coupled to ADC circuit 132 by a switch 210. The chip further comprises an analog input connection pad 140A coupled by a switch 210A to ADC circuit 132. Switches 210 and 210A are preferably each coupled to a different input channel of ADC circuit 132. Preferably, switches 210 and 210A are capable of being activated during the self-test phase. Preferably, the chip further comprises an amplifier 230 (AMP) between pads 140 and 140A. In this configuration, as an example, pad 140A further is an analog output connection pad.

Preferably, the chip further comprises memory locations 220 storing logic levels of control of switches 150, 210, and 210A during the self-test phase. Memory locations 220 are preferably located in a rewritable non-volatile memory comprised in the digital circuit 110 of the chip. One can thus select, from among switches 152, 210, and/or 210A, those which are on during the self-test phase. To achieve this, the corresponding logic levels are written into memory locations 220.

In a self-test phase, when switch 210 is on, the self-test is carried out as described in relation with FIG. 1. When switch 210A is on, the signal 162 which reaches pad 140 is amplified by amplifier 230. Amplifier 230 supplies a signal 163. Signal 163 is received by ADC circuit 132, which supplies signal 164 to digital circuit 110. The operation of DAC circuit 130, of ADC circuit 132, and of amplifier 230 are thus simultaneously tested. By selecting that of switches 210 and 210A which is on during the self-test phase, it is chosen whether to test or not to test amplifier 230 at the same time as circuits 130 and 132.

In the case where the chip comprises a plurality of analog signal generators and/or a plurality of analog signal receivers, a plurality of links 150 comprising switches 152 couple the generators to the receivers. In self-test phase, the switches are controlled according to the contents of memory locations 220. This enables to select, for each of the generators, one or a plurality of the receivers to receive one or a plurality of signals transmitted by the generator in self-test phase. This enables to select, for each of the receivers, one or a plurality of the generators to generate one or a plurality of signals received by the receiver in self-test phase.

Preferably, the chip comprises a plurality of analog signal reception and generation circuits such as amplifier 230. Each of these circuits may have its input and its output coupled by switches 210 and 210A to an analog signal receiver such as ADC circuit 132. In self-test phase, the switches are controlled according to the contents of memory locations 220. This enables, for each analog signal transmitted in self-test phase, to choose whether or not to amplify the signal, and optionally to select one of the amplifiers for this amplification.

Preferably, it is provided for the writing into memory locations 220 to be protected by a password. Preferably, a circuit 240 is configured to write logic levels 242 into memory locations 220 only if a password P has been supplied to circuit 240. Circuit 240 is preferably comprised within digital circuit 110 of the chip. As an example, circuit 240 is a microprocessor configured to execute a program of protection by the password. Thus, only a user knowing the password may select from among the switches those which are on during the self-test phase.

Preferably, in a phase of use of the chip, switches 210 and 210A are controlled by logic signals having their levels stored in memory locations 250. Memory locations 250 are preferably non-volatile and rewritable. One can thus select from among switches 210 and/or 210A those which are on during the phase of use. To achieve this, the corresponding contents 252 are previously written into memory locations 250. In the shown example, when an analog signal is desired to be converted by ADC circuit 132, it can be chosen whether or not to amplify the signal with amplifier 230 before the conversion.

Preferably, the chip comprises a plurality of switches coupling the input/output pads of the chip to a plurality of analog signal generator and/or receiver circuits. The state of these switches is then controlled by the contents of memory locations 250. The analog circuits of the chip may then be reconfigured by modification of the content of memory locations 250. A user may select these contents so that the chip executes desired functions according to a targeted application. A same chip may thus execute various functions for various targeted applications.

The control levels of the switches applied in self-test phase and in phase of use may be different, due to the fact that these levels are stored in respective locations 220 and 250. The tests carried out during the self-test phase may be selected independently from the functions executed during the phase of use. This enables to perform a more complete self-test than for a chip where only the functions executed during the phase of use can be self-tested.

Figure 3:
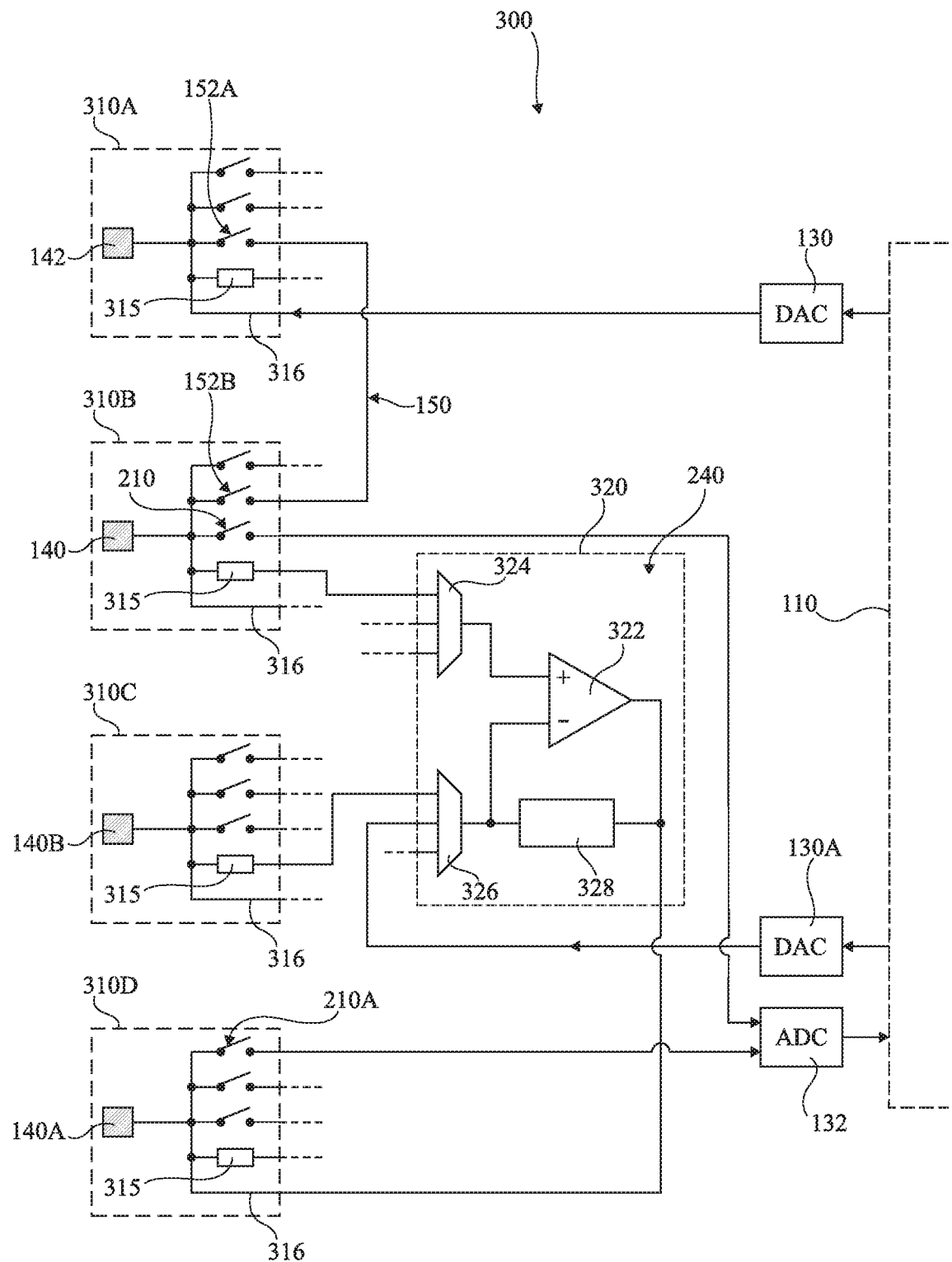
FIG. 3 schematically shows another embodiment of an electronic chip with analog inputs/outputs.

FIG. 3 schematically shows another embodiment of an electronic chip 300 with analog inputs/outputs. Chip 300 comprises the elements of chip 200 of FIG. 2, coupled together identically or similarly. Link 150 here comprises two switches 152A and 152B series-connected between pads 142 and 140. The control levels of switches 152A and 152B are preferably stored in memory locations 220 (FIG. 2). As an example, the chip further comprises an additional input connection pad 140B coupled to amplifier 240.

To design electronic chip 300, a computer design method is implemented. A method of computer design of an integrated circuit chip typically uses a design block library. Each block defines a set of elements of the chip circuits and of connections between these elements. On design, connections between the blocks are defined. The connections and the blocks thus obtained are compatible with usual routing techniques, enabling to then define the layout in the chip of the elements and of tracks connecting these elements.

Each connection pad 142, 140, 140B, 140A of chip 300 is comprised in a design block, respectively 310A, 310B, 310C, 310D. Each design block comprises, in addition to the connection pad, one or a plurality of, preferably three, switches coupled, preferably connected, to the connection pad. Preferably, each design block further comprises a resistive element 315 coupled, for example, connected, to the connection pad. Preferably, each design block further comprises a direct connection 316 to the connection pad.

Preferably, some of the design blocks are identical. In the illustrated example, the four blocks are identical. Switch 152A is one of the switches of block 310A, and switch 152B is one of the switches of block 310B. Each switch 152A, 152B is thus associated with respective pad 140, 142 in one of the design blocks. As an example, switch 210 is one of the switches of block 310B. Switch 210A is one of the switches of block 310D.

Preferably, amplifier 240 is defined by a design block 320. This block preferably comprises an operational amplifier 322, a multiplexer 324 having its output coupled to the non-inverting input of amplifier 322, a multiplexer 326 having its output coupled to the inverting input of amplifier 322, and a feedback circuit 328 coupling the inverting input and the output of amplifier 322. Preferably, connections of resistors 315 of blocks 310B and 310C to the inputs of respective multiplexers 324 and 326 are defined.

A DAC circuit 130A coupling digital circuit 110 to an input of multiplexer 326 is for example provided. Preferably, DAC circuits 130 and 130A correspond to design blocks, for example, identical. ADC circuit 132 preferably corresponds to a design block.

To design link 150, it is sufficient to define a connection between switches 152A and 152B. Thus, the design of chip 300 is performed in particularly simple fashion based on that of a similar chip which does not comprise a link 150.

In the chip thus designed, it is preferably provided for control values of multiplexers 324 and 326 and for configuration parameters of feedback circuit 328 to be stored in memory locations 220 (FIG. 2). The origin of the signals applied to the inputs of amplifier 322 is self-test phase can then be selected. The configuration parameters of feedback circuit 328 in self-test phase can further be selected.

Preferably, it is provided for control values of multiplexers 324 and 326 and configuration parameters of feedback circuit 328 to be stored in memory locations 250 (FIG. 2). The origin of the signals applied to the inputs of amplifier 322 and the configuration parameters of the feedback circuit in phase of use can thus be selected. Such a selection is preferably chosen to carry out functions corresponding to the application.

The selected inputs of multiplexers 324 and 326 and the parameters of feedback circuit 328 may thus be different in self-test phase and in phase of use. This enables to select tests of the amplifier during the self-test independently from the functions carried out by the amplifier in use.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of performing a self-test of an electronic chip that comprises a plurality of pins, first and second analog input connection pads; an analog output connection pad; a digital circuit; an analog-to-digital converter coupled between the first and second analog input connection pads and the digital circuit; a digital-to-analog converter coupled between the first and second analog input connection pads and the digital circuit, a first switch coupled between the first analog input connection pad and the analog output connection pad; an amplifier having an input coupled to the first analog input connection pad and an output coupled to the second analog input connection pad; a second switch coupled between the input of the amplifier and the analog-to-digital converter; and a third switch coupled between the output of the amplifier and the analog-to-digital converter, the method comprising:

controlling the first, second, and third switches to selectively test the amplifier with the analog-to-digital converter and the digital-to-analog converter, wherein controlling the first, second, and third switches comprises:
closing the first switch;
using the digital-to-analog converter, transmitting a test signal from the analog output connection pad to the first analog input connection pad through the first switch; and
testing the test signal using the analog-to-digital converter, wherein the analog output connection pad or the first analog input connection pad is unconnected to any pin of the plurality of pins of the chip.

2. The method of claim 1, wherein the chip is configured to operate in a self-test mode and in an active mode, the first switch being closed only in the self-test mode.

3. The method of claim 1, further comprising:
converting a digital test signal into an analog test signal using the digital-to-analog converter, wherein the test signal is the analog test signal;
after the transmitting of the test signal, converting the analog test signal into a converted digital test signal using the analog-to-digital converter; and
comparing the digital test signal to the converted digital test signal.

4. The method of claim 3, further comprising amplifying the analog test signal using the amplifier before converting the analog test signal into the converted digital test signal.

5. The method of claim 1, wherein the first analog input connection pad and the analog output connection pad are respectively directly connected to identical first and second switch circuits, wherein closing the first switch comprises closing a switch of the first switch circuit and closing a switch of the second switch circuit.

6. A system-on-chip comprising:
first and second analog inputs;
an analog output;
a digital circuit;
an analog-to-digital converter coupled between the first and second analog inputs and the digital circuit;
a digital-to-analog converter coupled between the digital circuit and the analog output;

a first switch coupled between the first analog input and the analog output;
an amplifier having an input coupled to the first analog input and an output coupled to the second analog input;
a second switch coupled between the input of the amplifier and the analog-to-digital converter; and
a third switch coupled between the output of the amplifier and the analog-to-digital converter, wherein the system-on-chip is configured to control the first, second, and third switches to selectively test the amplifier with the analog-to-digital converter and the digital-to-analog converter.

7. The chip of claim 6, wherein the chip comprises a plurality of switches series-connected between the first analog input and the analog output.

8. The chip of claim 7, further comprising first memory locations storing logic levels of control of the plurality of switches.

9. The chip of claim 8, wherein the chip is configured so that writing into the first memory locations is protected with a password.

10. The chip of claim 6, further comprising second memory locations storing logic levels of control of the second switch.

11. The chip of claim 6, wherein first memory locations are configured to further store additional logic levels of control of the second switch.

12. The chip of claim 6, further comprising:
a plurality of pins;
first and second analog input pads respectively coupled to the first and second analog inputs; and
an analog output pad coupled to the analog output, wherein the first or second analog input pads or the analog output pad is unconnected to any pin of the plurality of pins.

13. The chip of claim 12, wherein each of the first and second analog input pads and the analog output pad is respectively directly connected to identical switch circuits, each of the switch circuits comprising a plurality of switches, each of the plurality of switches of the switch circuits directly connected to the associated pad, wherein the switch circuit directly connected to the first analog input pad comprises the second switch, and wherein the switch circuit directly connected to the second analog input pad comprises the third switch.

14. The chip of claim 13, further comprising a further digital-to-analog converter, and a third analog input pad, wherein the amplifier comprises:
a multiplexer having a first input coupled to an output of the further digital-to-analog converter, and a second input coupled to the third analog input pad via a first resistor;
an operational amplifier having a first input coupled to the second switch, a second input coupled an output of the multiplexer, and an output directly connected to the analog output pad; and
a feedback circuit coupled between the second input of the operational amplifier and an output of the operational amplifier.

15. A method of operating the chip of claim 6, the method comprising operating the chip in a self-test mode comprising:
transmitting a digital signal from the digital circuit to the digital-to-analog converter;
converting the digital signal into an analog signal;
applying the analog signal to the analog-to-digital converter via the first switch;
converting the analog signal into a converted digital signal; and
outputting the converted digital signal to the digital circuit.

16. The method of claim 15, further comprising comparing the digital signal to the converted digital signal at the digital circuit.

17. The method of claim 15, further comprising amplifying the analog signal with the amplifier before converting the analog signal into the converted digital signal.

18. The method of claim 15, further comprising operating the chip in a normal operation mode, wherein the first switch is open during all of the normal operation mode.

19. A method of designing a chip that comprises a plurality of analog input connection pads, a plurality of analog output connection pads, a plurality of switches coupled between the plurality of analog input connection pads and the plurality of analog output connection pads, a digital circuit, an analog-to-digital converter, a digital-to-analog converter, and an amplifier, wherein the plurality of analog input connection pads comprises first and second analog input connection pads, wherein the analog-to-digital converter is coupled between the first and second analog input connection pads and the digital circuit, wherein the digital-to-analog converter is coupled between the digital circuit and the a first analog output connection pad of the plurality of analog output connection pads, wherein the plurality of switches comprises first, second, and third switches coupled between the first analog input connection pad and the first analog output connection pad, a second switch coupled between an input of the amplifier and the analog-to-digital converter, and a third switch coupled between an output of the amplifier and the analog-to-digital converter, wherein the input of the amplifier is coupled to the first analog input connection pad, and the output of the amplifier is coupled to the second analog input connection pad, and wherein the first, second, and third switches are controlled to selectively test the amplifier with the analog-to-digital converter and the digital-to-analog converter, the method comprising:
associating each analog input connection pad of the plurality of analog input connection pads with an associated analog output connection pad of the plurality of analog output connection pads so that there are a plurality of pairs of associated input and output connection pads; and
associating each pair with one of the switches of the plurality of switches in a design block of a computer design library, the design blocks being identical for the analog input connection pads and the analog output connection pads, wherein each design block comprises a resistor connected to the associated pad.

20. The method of claim 19, wherein each design block comprises a plurality of further switches, each further switch of the plurality of further switches being directly connected to the associated pad.

21. A method of self-test of an electronic chip that includes first and second analog signal input, an analog signal output, a digital circuit; an analog signal receiver coupled between the first and second analog signal inputs and the digital circuit, an analog signal generator coupled between the digital circuit and the analog signal output, a first switch coupled between the first analog signal input and the analog signal output, an amplifier having an input coupled to the first analog signal input and an output coupled to the second analog signal input, a second switch coupled between the input of the amplifier and the analog signal receiver, and a third switch coupled between the output of the amplifier and the analog signal receiver, the method comprising:

controlling the first, second, and third switches to selectively test the amplifier with the analog signal receiver and the analog signal generator, wherein controlling the first, second, and third switches comprises:

closing the first switch to couple the analog signal output to the first analog signal input;

performing a self-test operation that comprises simultaneously testing the analog signal generator and the analog signal receiver, and testing the amplifier with the analog signal generator and the analog signal receiver; and opening the first switch to isolate the analog signal output from the first analog signal input so that the chip can be operated in a normal operation mode.

22. The method of claim 21, wherein performing the self-test operation comprises:

generating a test signal by the analog signal generator and applying the test signal to the analog signal output; and receiving the test signal by the analog signal receiver at the first analog signal input, the test signal being transmitted from the analog signal output to the first analog signal input via the first switch.

23. The method of claim 22, wherein the analog signal generator comprises a digital-to analog converter and the analog signal receiver comprises an analog-to-digital converter.

\* \* \* \* \*